(12) United States Patent
Tsuzuki et al.

(10) Patent No.: US 11,968,462 B2
(45) Date of Patent: *Apr. 23, 2024

(54) SOLID-STATE IMAGE PICKUP APPARATUS, CORRECTION METHOD, AND ELECTRONIC APPARATUS

(71) Applicant: SONY SEMICONDUCTOR SOLUTIONS CORPORATION, Kanagawa (JP)

(72) Inventors: Takeru Tsuzuki, Kanagawa (JP); Katsumi Nishikori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/170,291

(22) Filed: Feb. 16, 2023

(65) Prior Publication Data

US 2023/0209221 A1 Jun. 29, 2023

Related U.S. Application Data

(63) Continuation of application No. 17/090,666, filed on Nov. 5, 2020, now Pat. No. 11,632,603, which is a (Continued)

(30) Foreign Application Priority Data

Jul. 6, 2016 (JP) .................................. 2016-133966

(51) Int. Cl.
*H04N 25/704* (2023.01)
*H01L 27/146* (2006.01)
(Continued)

(52) U.S. Cl.
CPC ..... *H04N 25/704* (2023.01); *H01L 27/14605* (2013.01); *H01L 27/14607* (2013.01);
(Continued)

(58) Field of Classification Search
CPC ...... H04N 25/704; H04N 23/67; H04N 25/67; H04N 25/61; H01L 27/14605; H01L 27/14607; H01L 27/14627
See application file for complete search history.

(56) References Cited

U.S. PATENT DOCUMENTS 8,675,282 B2 3/2014 Ozawa
10,863,124 B2 * 12/2020 Tsuzuki ............ H01L 27/14605
(Continued)

FOREIGN PATENT DOCUMENTS

JP  H01-216308    8/1989
JP  H01216306 A   8/1989
(Continued)

OTHER PUBLICATIONS

International Search Report prepared by the Japan Patent Office dated Jul. 10, 2017, for International Application No. PCT/JP2017/022986.
(Continued)

*Primary Examiner* — Georgia Y Epps
*Assistant Examiner* — Don J Williams
(74) *Attorney, Agent, or Firm* — SHERIDAN ROSS P.C.

(57) ABSTRACT

The present disclosure relates to a solid-state image pickup apparatus, a correction method, and an electronic apparatus, enabled to suppress an apparent uncomfortable feeling of an image output from a solid-state image pickup apparatus in which pixels of different OCL shapes are mounted mixedly. A solid-state image pickup apparatus according to an aspect of the present disclosure includes a pixel array in which a first pixel in which an OCL (On Chip Lens) of a standard
(Continued)

size is formed and a second pixel in which an OCL of a size different from the standard size is formed are present mixedly, and a correction section that corrects a pixel value of the first pixel that is positioned in the vicinity of the second pixel among the first pixels on the pixel array. The present disclosure can be applied to, for example, a CMOS image sensor.

20 Claims, 9 Drawing Sheets

Related U.S. Application Data continuation of application No. 16/312,417, filed as application No. PCT/JP2017/022986 on Jun. 22, 2017, now Pat. No. 10,863,124.

(51) Int. Cl.
  *H04N 23/67* (2023.01)
  *H04N 25/61* (2023.01)
  *H04N 25/67* (2023.01)

(52) U.S. Cl.
  CPC ....... *H01L 27/14627* (2013.01); *H04N 23/67* (2023.01); *H04N 25/61* (2023.01); *H04N 25/67* (2023.01)

(56) References Cited

U.S. PATENT DOCUMENTS

| | | | |
|---|---|---|---|
| 2009/0128671 A1 | 5/2009 | Kusaka | |
| 2012/0033120 A1 | 2/2012 | Nakamura et al. | |
| 2012/0043634 A1 | 2/2012 | Kurihara | |
| 2012/0211850 A1 | 8/2012 | Kuboi | |
| 2013/0002911 A1 | 1/2013 | Miyashita et al. | |
| 2013/0155271 A1 | 6/2013 | Ishii | |
| 2014/0307134 A1 | 10/2014 | Kanda et al. | |
| 2015/0195466 A1 | 7/2015 | Takae | |
| 2021/0058577 A1 | 2/2021 | Tsuzuki et al. | |

FOREIGN PATENT DOCUMENTS

| | | |
|---|---|---|
| JP | 2009-124573 | 6/2009 |
| JP | 2010-252277 | 11/2010 |
| JP | 2012-064924 | 3/2012 |
| JP | 2013-148873 | 8/2013 |
| JP | 2014-089432 | 5/2014 |
| JP | 2014-135564 | 7/2014 |
| JP | 2014-165787 | 9/2014 |
| WO | WO 2011/155297 | 12/2011 |
| WO | WO 2014/208047 | 12/2014 |
| WO | WO 2016/098640 | 6/2016 |

OTHER PUBLICATIONS

Extended European Search Report for European Patent Application No. 17824015.6, dated Mar. 15, 2019, 8 pages.
Decision to Grant (with English translation) for Japan Patent Application No. 2022-034191, dated Jan. 24, 2023, 5 pages.
Official Action for U.S. Appl. No. 16/312,417, dated Feb. 6, 2020, 11 pages.
Notice of Allowance for U.S. Appl. No. 16/312,417, dated Aug. 5, 2020, 8 pages.
Notice of Allowance for U.S. Appl. No. 17/090,666, dated Oct. 24, 2022, 9 pages.

* cited by examiner

SOLID-STATE IMAGE PICKUP APPARATUS, CORRECTION METHOD, AND ELECTRONIC APPARATUS

CROSS-REFERENCE TO RELATED APPLICATIONS

This application is continuation of U.S. application Ser. No. 17/090,666, filed Nov. 5, 2020, which is a continuation of U.S. application Ser. No. 16/312,417 filed Dec. 21, 2018, now U.S. Pat. No. 10,863,124, which is a national stage application under 35 U.S.C. 371 and claims the benefit of PCT Application No. PCT/JP2017/022986 having an international filing date of Jun. 22, 2017, which designated the United States, which PCT application claimed the benefit of Japanese Patent Application No. 2016-133966 filed Jul. 6, 2016, the entire disclosures of each of which are incorporated herein by reference.

BACKGROUND OF THE INVENTION

Technical Field

The present disclosure relates to a solid-state image pickup apparatus, a correction method, and an electronic apparatus, and in particular, relates to a solid-state image pickup apparatus, a correction method, and an electronic apparatus, enabled to correct a pixel value of a standard pixel for generating a color signal that is present on the periphery of a phase difference detection pixel for generating a phase difference signal.

Background Art

As a method of an AF (Auto Focus) system of a digital camera etc., an imaging plane phase difference AF is known.

In an image sensor for realizing the imaging plane phase difference AF, a partially shaded phase difference detection pixel that outputs a pixel value for generating a phase difference signal is arranged on a pixel array in which a standard pixel that outputs a color signal is arranged vertically and horizontally. Note, however, that in a case of using the partially shaded phase difference detection pixel, since an appropriate phase difference signal is not obtained at the time of low-light intensity, an AF performance may be decreased.

As an image sensor capable of suppressing such a situation, a configuration in which the phase difference detection pixel having a 2×1 OCL (On Chip Lens) structure (hereinafter, simply referred to as a 2×1 OCL pixel) is discretely arranged between standard pixels has been proposed. The OCL is a lens that is formed on the side of receiving light of pixels in order to improve light collection efficiency of the pixels. Further, the phase difference detection pixel having the 2×1 OCL structure includes an OCL having a horizontally long shape (or vertically long shape) for two pixels of the standard pixel on a receiving light surface. Further, light passing through the right side and the left side of the OCL, respectively, is received by different receiving light elements within the phase difference detection pixel to thereby generate a phase difference signal from a pixel value to be obtained.

Note that, in a case where an output from the image sensor in which a 2×1 OCL pixel is mounted mixedly on the pixel array is used as image data, appropriate interpolation processing needs to be performed to obtain a color signal corresponding to a position of the 2×1 OCL pixel. As the interpolation processing, for example, direction interpolation processing in which directivity in a peripheral area of the 2×1 OCL pixel is detected and interpolated, correlation interpolation processing in which a level of each color in the peripheral area is used, or the like can be used.

CITATION LIST

Patent Literature

PTL 1: Japanese Patent Laid-Open No. 1989-216306

SUMMARY OF THE INVENTION

Technical Problem

However, even if a correction is performed on a position of the 2×1 OCL pixel, in a case where the position is a flat portion of the image, an apparent uncomfortable feeling may be allowed to be generated near to the 2×1 OCL pixel due to a color signal that is an output of the standard pixel adjacent to the 2×1 OCL pixel.

Specifically, in a manufacturing process of the image sensor in which the 2×1 OCL pixel is mounted mixedly, the 2×1 OCL pixel is different, in a shape of the formed OCL, from the standard pixel on the periphery thereof. Therefore, even an OCL shape of the standard pixel on the periphery of the 2×1 OCL pixel is slightly deformed from an original shape. Further, a size of the standard pixel is increased or decreased and a symmetry of the shape is broken.

Such a deformation of the OCL of the standard pixel exerts an influence on a sensitivity of the standard pixel and the obtained color signal is increased or decreased minutely from a value that ought to be originally obtained. As a result, uncomfortable feeling is caused in the flat portion.

Such a deformation of the OCL of the standard pixel exerts an influence on a sensitivity of the standard pixel and the obtained color signal is increased or decreased minutely from a value that ought to be originally obtained. As a result, uncomfortable feeling is caused in the flat portion.

The present disclosure is performed by considering such a situation and aims at suppressing an apparent uncomfortable feeling of an image output from a solid-state image pickup apparatus in which pixels having different OCL shapes are mounted mixedly.

Solution to Problem

According to a first aspect of the present disclosure, a solid-state image pickup apparatus includes: a pixel array in which a first pixel in which an OCL (On Chip Lens) of a standard size is formed and a second pixel in which an OCL of a size different from the standard size is formed are present mixedly; and a correction section that corrects a pixel value of the first pixel that is positioned in the vicinity of the second pixel among the first pixels on the pixel array.

The correction section may correct a pixel value of a third pixel that is positioned in the vicinity of the second pixel and in which a shape of the OCL is deformed from an original standard size among the first pixels on the pixel array.

An OCL having a size larger than the standard size may be formed in the second pixel.

The correction section may calculate a correction value that is replaced with a pixel value of the third pixel as a correction target by using a pixel value of the first pixel that is positioned in the vicinity of the third pixel as the correction target.

The correction section may decide a threshold for determining whether or not the calculated correction value is applied.

The correction section may decide the threshold by using a parameter that is different depending on a positional relationship between the third pixel as the correction target and the second pixel.

The correction section may decide the threshold by using a parameter that is different depending on a position in an image of the third pixel as the correction target.

The correction section may determine whether or not the calculated correction value is applied on the basis of a flatness in a peripheral area of the third pixel as the correction target.

The second pixel may be a phase difference detection pixel.

According to the first aspect of the present disclosure, the solid-state image pickup apparatus may further include an interpolation section that interpolates a pixel value corresponding to a position of the second pixel.

According to a first aspect of the present disclosure, a method for correcting a solid-state image pickup apparatus including a pixel array in which a first pixel in which an OCL (On Chip Lens) of a standard size is formed and a second pixel in which an OCL of a size different from the standard size is formed are present mixedly and a correction section that corrects an output of the pixel array, the method includes a correction step of correcting, by the correction section, a pixel value of the first pixel that is positioned in the vicinity of the second pixel among the first pixels on the pixel array.

According to the first aspect of the present disclosure, a pixel value of the first pixel that is positioned in the vicinity of the second pixel among the first pixels on the pixel array is corrected.

According to a second aspect of the present disclosure, an electronic apparatus includes a solid-state image pickup apparatus to be mounted thereon, in which the solid-state image pickup apparatus includes: a pixel array in which a first pixel in which an OCL (On Chip Lens) of a standard size is formed and a second pixel in which an OCL of a size different from the standard size is formed are present mixedly; and a correction section that corrects a pixel value of the first pixel that is positioned in the vicinity of the second pixel among the first pixels on the pixel array.

According to the second aspect of the present disclosure, the pixel value of the first pixel that is positioned in the vicinity of the second pixel among the first pixels on the pixel array is corrected by the solid-state image pickup apparatus.

Advantageous Effects of Invention

According to the first and second aspects of the present disclosure, it is possible to correct a pixel value of a second pixel in which a shape of an OCL is deformed from a standard shape, which is positioned on the periphery of a first pixel and in which the shape of the OCL is different from the standard shape.

Further, according to the first and second aspects of the present disclosure, it is possible to suppress an apparent uncomfortable feeling that may occur on an image.

DETAILED DESCRIPTION OF THE INVENTION

Description of Embodiments

Hereinafter, a best mode (hereinafter, referred to as an embodiment) for carrying out the present disclosure will be described in detail with reference to the drawings.

Note that, in the following description, a pixel having an OCL occupying an area for one pixel for generating a color signal is referred to as a standard pixel among a plurality of pixels arranged in a pixel array of an image sensor (solid-state image pickup apparatus). Further, a phase difference detection pixel having an OCL (i.e., 2×1 OCL) occupying an area for two pixels that output a pixel value for generating a phase difference signal is also referred to as a 2×1 OCL pixel or an irregular pixel. In addition, among the standard pixels, a pixel in which a shape of the OCL is affected by a formation of the 2×1 OCL and is deformed from an original shape is referred to as a deformed pixel.

The image sensor according to the present embodiment interpolates a color signal corresponding to a position of the 2×1 OCL pixel and, at the same time, corrects a color signal of the deformed pixel. The process permits an apparent uncomfortable feeling on the periphery of the 2×1 OCL pixel in a flat portion to be suppressed.

Note that shapes of the phase difference detection pixel and an OCL thereof are not limited to 2×1. When the shape is other than 1×1 that is a shape of the standard pixel and an OCL thereof, it may be, for example, 1×2, 2×2, or the like. In addition, a pixel having two or more kinds of irregular OCLs may be mounted mixedly on the pixel array.

Configuration Example of Image Sensor according to the Present Embodiment

Figures 1, 2:
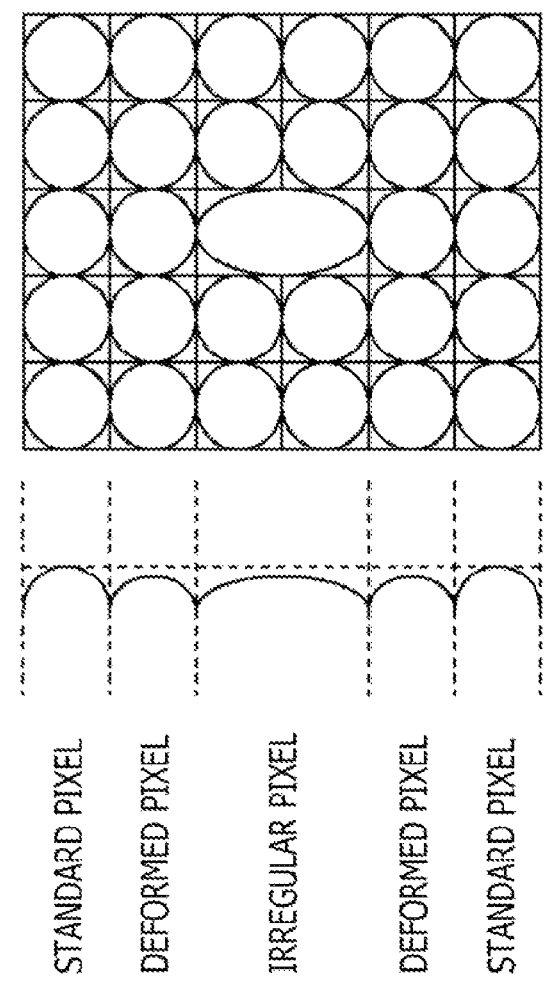
FIG. 1 is a diagram depicting an arrangement example of a color filter.
FIG. 2 is a diagram depicting shapes of OCLs of a standard pixel, a deformed pixel, and an irregular pixel.

FIG. 1 depicts an array example of a color filter in the pixel array 11 that is mounted on the image sensor 10 (depicted in FIG. 5) according to the present embodiment.

In this arrangement example, the standard pixels and the deformed pixels basically form a Bayer array. Note that, R (RED), G (GREEN), and B (BLUE) in the figure indicate an arrangement of the standard pixels (including the deformed pixels) that are covered by color filters of R, G, and B, respectively.

Further, PD in the figure indicates an arrangement of the 2×1 OCL pixel and is discretely arranged on the entire pixel array 11. Note that, it is assumed that the PD occupies an area for two pixels of G and B in the Bayer array and is covered with a color filter of G. Note that, a color of the color filter covering the 2×1 OCL pixel is not limited to G; further, it may be R or B.

Note that, the arrangement example of the standard pixel is not limited to the above-described Bayer array; further, it may be applied to other arrays.

Next, the shape of the OCL of the standard pixels, deformed pixels, and irregular pixels (2×1 OCL pixels) that are mounted mixedly on the pixel array 11 will be described with reference to FIGS. 2 to 4.

FIG. 2 depicts a cross-sectional shape in a transverse direction of the OCLs of the standard pixel, the deformed pixel, and the irregular pixel. FIG. 3 is a cross-sectional diagram depicting a specific example of the OCL of the deformed pixel. FIG. 4 is a top diagram depicting a specific example of the OCL of the deformed pixel.

As depicted in FIG. 2, the OCL of the standard pixel occupies an area for one pixel, which is circular. By contrast, the OCL of the irregular pixel occupies an area for two pixels, which is horizontally long and has an elliptical shape. In the irregular pixel, incident light that passes through a left-side portion and a right-side portion of the OCL having an elliptical shape, respectively, is incident on different photoelectric conversion sections (not depicted) to thereby generate a phase difference signal.

As apparent from the cross-sectional shape depicted in FIG. 2, it is understood that a shape of the OCL is slightly deformed from an original shape in the deformed pixel adjacent to the irregular pixel. In a manufacturing process of the pixel array 11, the above fact is caused by an influence at the time of forming the 2×1 OCL of the irregular pixel.

Note that, as depicted in FIG. 2, in a case where the irregular pixel is lower in a height of the OCL than the standard pixel, a light collection efficiency tends to be reduced to slightly decrease sensitivity.

Figure 3:
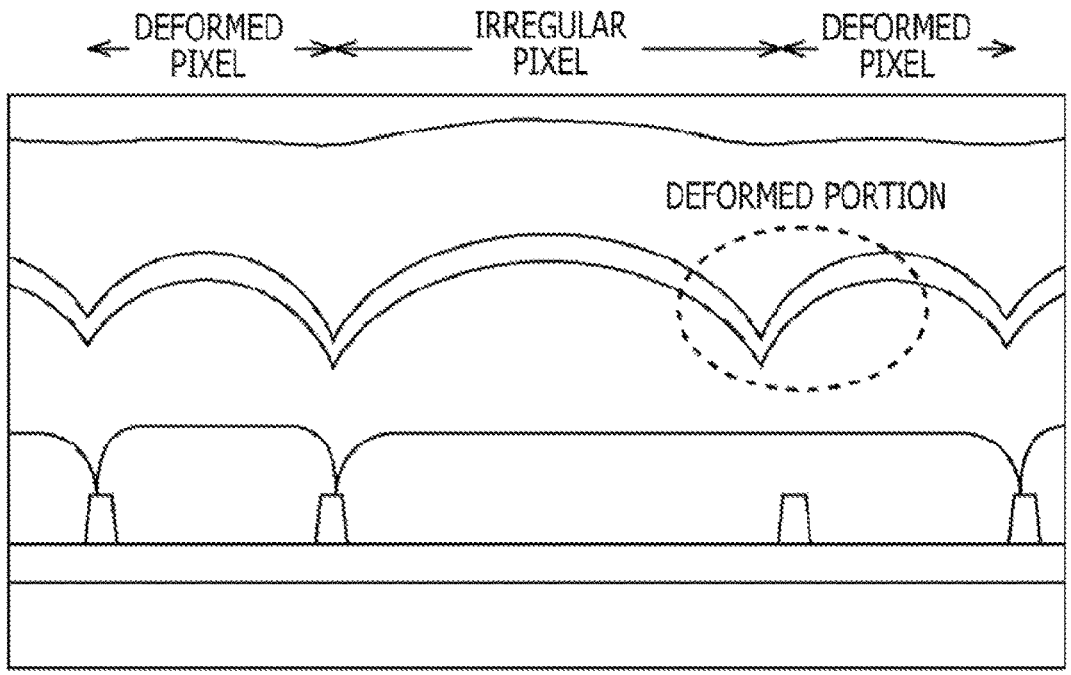
FIG. 3 is a cross-sectional diagram depicting a specific example of a deformed OCL of the deformed pixel.

Further, as depicted in FIG. 3, a symmetry may be broken in the OCL of the deformed pixel. In this case, the sensitivity fluctuates due to an angle of light that is incident on the OCL. Therefore, the sensitivity is increased or decreased depending on a position of the deformed pixel in the image.

Figure 4:
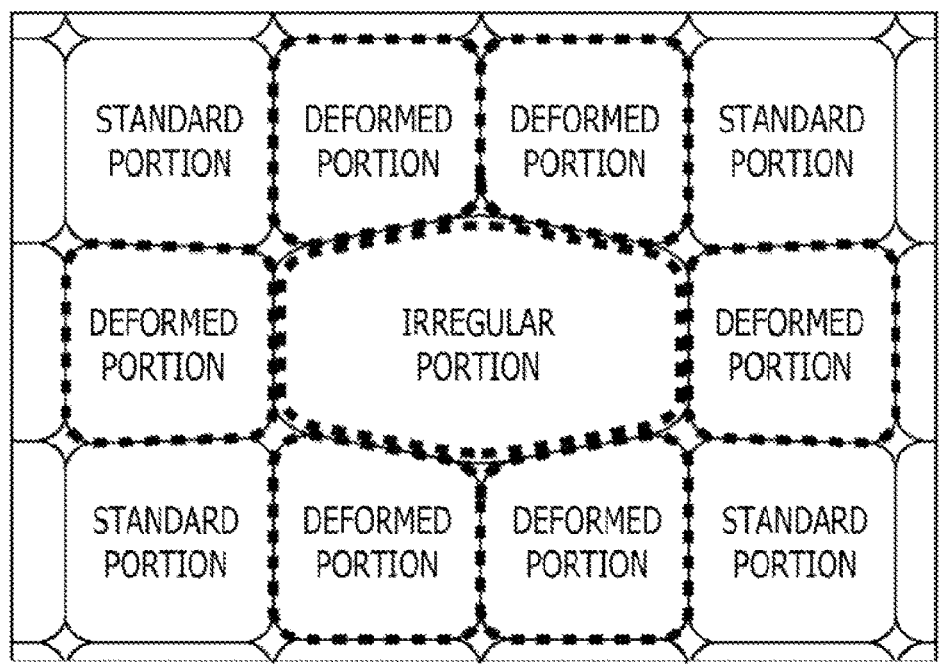
FIG. 4 is a top diagram depicting a specific example of the deformed OCL of the deformed pixel.

Further, as depicted in FIG. 4, the deformed pixel in which the shape of the OCL has changed may appear not only in a transverse direction of the irregular pixel but also in a longitudinal direction thereof. Therefore, the above deformed pixel is also a correction target of the pixel value.

In examples depicted in FIGS. 2 and 4, pixels adjacent to the left, right, top and bottom of the irregular pixel are deformed pixels. Further, an influence at the time of forming the 2×1 OCL of the irregular pixel in the manufacturing process may extend to pixels in a wider range. In such a case, all pixels between the irregular pixel and the standard pixels in which the OCL is not deformed just have to be set as a deformed pixel to be a processing target of deformed pixel correction processing described below.

Figure 5:
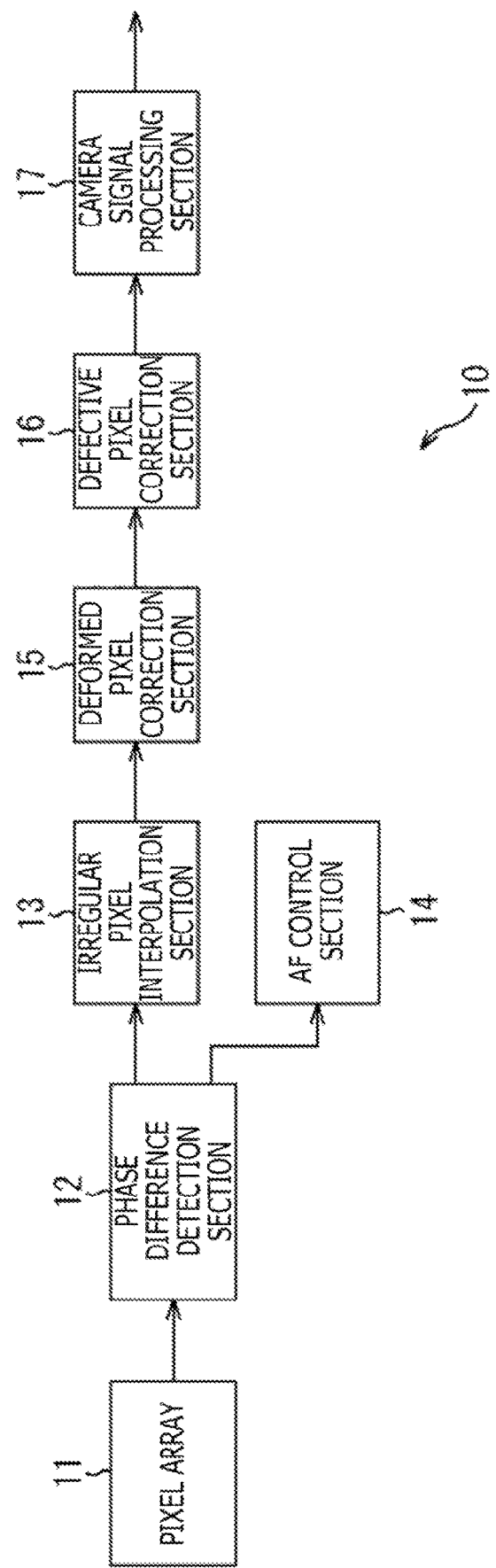
FIG. 5 is a block diagram depicting a configuration example of an image sensor to which the present disclosure is applied.

Next, FIG. 5 depicts a configuration example of an image sensor (solid-state image pickup apparatus) according to an embodiment of the present disclosure. The image sensor 10 is mounted on an electronic apparatus having an imaging plane phase difference AF function. Note that the image sensor 10 may be a surface irradiation type or a back surface irradiation type. In addition, the image sensor 10 may be a laminated type including a plurality of substrates.

The image sensor 10 includes a pixel array 11, a phase difference detection section 12, an irregular pixel interpolation section 13, an AF control section 14, a deformed pixel correction section 15, a defective pixel correction section 16, and a camera signal processing section 17.

The pixel array 11 outputs each output of the standard pixel, deformed pixel, and irregular pixel mounted mixedly as depicted in FIGS. 1 and 2 to the phase difference detection section 12. Note that, in the output of the pixel array 11 in this stage, the standard pixel and the deformed pixel have any one of the color signals of R, G, and B and the irregular pixel has a pixel value for generating a phase difference signal.

From among the outputs of the pixel array 11, on the basis of a pixel value of the irregular pixel, the phase difference detection section 12 detects a phase difference signal corresponding to a deviation in a focus and outputs the phase difference signal to the irregular pixel interpolation section 13 and the AF control section 14. Further, the phase difference detection section 12 outputs a color signal of the standard pixel and the deformed pixel to the irregular pixel interpolation section 13.

On the basis of an input from a preceding stage, the irregular pixel interpolation section 13 interpolates a color signal in a position of the phase difference pixel (irregular pixel) by using a predetermined interpolation method (a direction interpolation method in which directivity in a peripheral area is detected and interpolated, a correlation interpolation method in which a level of each color in a peripheral area is used, or the like). Further, the irregular pixel interpolation section 13 outputs a color signal interpolated on a position of the irregular pixel, and a color signal of the standard pixel and the deformed pixel to the deformed pixel correction section 15.

On the basis of the detected phase difference signal, the AF control section 14 generates a lens control signal for driving a focus lens and outputs the lens control signal to a lens drive section (either is not depicted).

On the basis of an input from the preceding stage, the deformed pixel correction section 15 performs correction processing on a color signal of the deformed pixel. Details of the correction processing will be described below. Further, the deformed pixel correction section 15 outputs a color signal interpolated on a position of the irregular pixel, a corrected color signal of the deformed pixel, and a color signal of the standard pixel to the defective pixel correction section 16.

On the basis of an input from the preceding stage, the defective pixel correction section 16 interpolates a color signal of the defective pixel. Further, the defective pixel correction section 16 outputs a color signal interpolated on a position of the irregular pixel, a corrected color signal of the deformed pixel, a color signal of the standard pixel, and an interpolated color signal of the defective pixel to the camera signal processing section 17.

The camera signal processing section 17 performs predetermined camera signal processing (white balance processing, demosaic processing, linear matrix processing, gamma correction processing, or the like) on any of the color signals of R, G, and B included in each pixel. Further, the camera signal processing section 17 outputs an RGB image in which each pixel obtained as a result has all color signals of R, G, and B to the following stage.

Operation of the Image Sensor 10

In the image sensor 10, the phase difference detection signal is detected by using the phase difference detection section 12 from the output of the pixel array 11 to thereby perform AF control. Further, a color signal is interpolated on a position of the irregular pixel by using the irregular pixel interpolation section 13, a color signal of the deformed pixel is corrected by using the deformed pixel correction section 15, and a color signal of the defective pixel is interpolated by using the defective pixel correction section 16. Further, on the basis of the correction results, the RGB image is generated and output by using the camera signal processing section 17.

Note that, a circuit configuration and processing sequence of the irregular pixel interpolation section 13, the deformed pixel correction section 15, and the defective pixel correction section 16 need not be connected in series as depicted in the figure. Further, the above sections may be connected in parallel to each other and may be allowed to perform each processing at the same time. Through the process, it is possible to more quickly output the RGB image from the image sensor 10.

Detailed Configuration Example of the Deformed Pixel Correction Section 15

Figure 6:
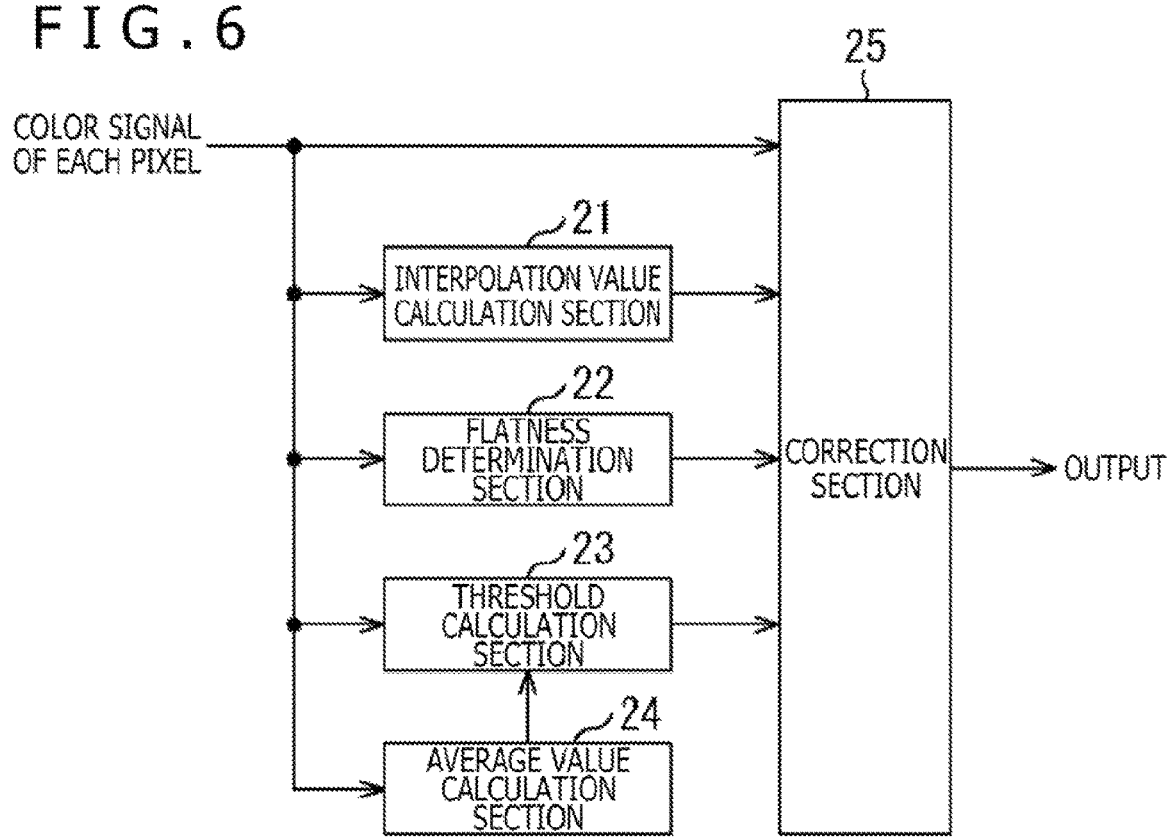
FIG. 6 is a block diagram depicting a configuration example of a deformed pixel correction section.

Next, FIG. 6 depicts a detailed configuration example of the deformed pixel correction section 15. The deformed pixel correction section 15 includes a correction value calculation section 21, a flatness determination section 22, a threshold calculation section 23, an average value calculation section 24, and a correction section 25.

The correction value calculation section 21 calculates a correction value for each deformed pixel in which a pixel value is corrected, and outputs the correction value to the correction section 25. Specifically, among pixels that are present in a predetermined area centering on the deformed pixel, the correction value calculation section 21 calculates as a correction value an average value of pixel values of the deformed pixel, excluding the irregular pixels and the other deformed pixels, and the standard pixel. Alternatively, the correction value calculation section 21 detects a directivity of a texture on the periphery of the deformed pixel and generates the correction value by using a direction interpolation using pixels along the detected direction. Note that, a method for calculating the correction value in the correction value calculation value 21 is arbitrary and any method except the above-described calculation method may be used.

The flatness determination section 22 determines flatness on the periphery of the deformed pixel to correct the pixel value and outputs a determination result to the correction section 25. Specifically, the flatness determination section 22 calculates a frequency distribution regarding differences of the pixel values of the pixels that are present in a predetermined area centering on the deformed pixel. Then, if a rate of the pixels is high in which the calculated difference is equal to or smaller than the threshold, it is determined that the deformed pixel is present in a flat area or in an area having a simple texture such as a staircase pattern. Alternatively, a two-dimensional high-pass filter may be applied thereto and flatness may be determined on the basis of whether or not a value of the output is equal to or smaller than the threshold. Note that a method for determining the flatness by the flatness determination section 22 is arbitrary and any method except the above-described determination method may be used.

The threshold calculation section 23 calculates a lower limit threshold and upper limit threshold for determining whether a correction is performed by using the calculated correction value, and outputs the lower limit threshold and the upper limit threshold to the correction section 25. Specifically, in a case where the calculated correction value is present between the lower limit threshold and the upper limit threshold, the correction is performed by using the calculated correction value. By contrast, in a case where the calculated correction value is not present between the lower limit threshold and the upper limit threshold, the correction is not performed.

The average value calculation section 24 calculates an average value of the pixel values of the pixels that are present in a predetermined area centering on the deformed pixel to correct the pixel value and outputs the average value to the threshold calculation section 23. Specifically, the average value calculation section 24 calculates an average value of a luminance signal converted by using all of the color signals of R, G, and B, or calculates an addition average value by using only a color signal of G.

The correction section 25 corrects a pixel value (color signal) of the deformed pixel on the basis of an input from the correction value calculation section 21, the flatness determination section 22, and the threshold calculation section 23.

Here, a calculation of the upper limit threshold and lower limit threshold by the threshold calculation section 23 will be described in detail.

Figure 7:
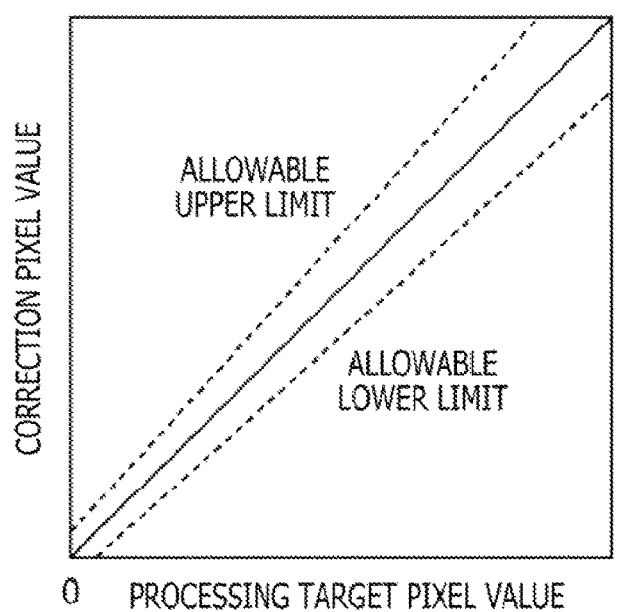
FIG. 7 is a diagram depicting an allowable range in a case where the deformed pixel is corrected.
Figure 8:
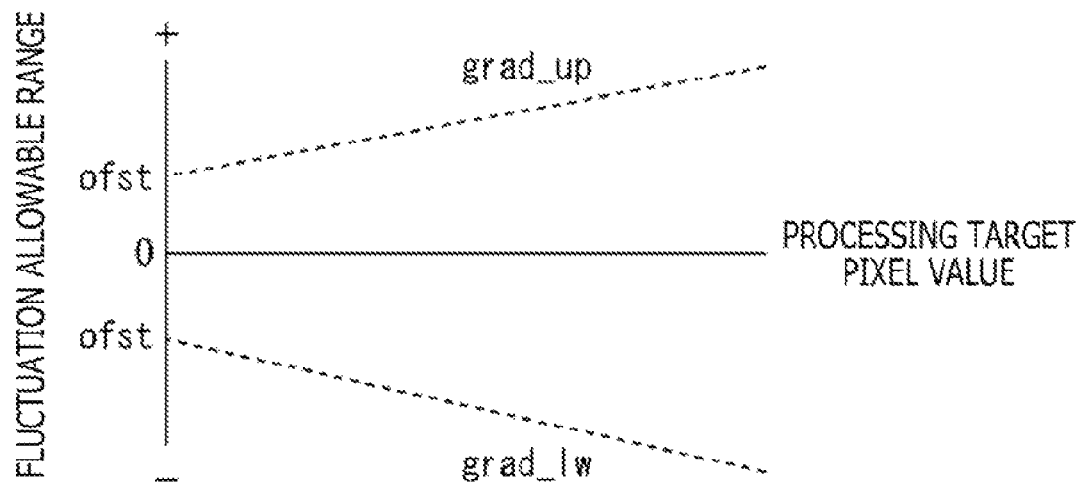
FIG. 8 is a diagram depicting an allowable range in the case where the deformed pixel is corrected.

FIGS. 7 and 8 depict an allowable range in a case where the pixel value of the deformed pixel is replaced with the correction value. Note that, in FIG. 7, a horizontal axis is set as the pixel value of the deformed pixel and a vertical axis is set as the correction value thereof. In FIG. 8, the horizontal axis is set as the pixel value of the deformed pixel and the vertical axis is set as a change allowable range at the time of correcting the pixel value.

Fluctuation of the pixel value of the deformed pixel is caused by a change in a sensitivity due to a deformation of the OCL. Therefore, the above fluctuation is not related to the amount of light incident on the adjacent irregular pixel, namely, the pixel value of the irregular pixel. The amount of fluctuation of the pixel value in the deformed pixel increases or decreases in a manner proportional to the pixel value.

Therefore, in a case where correcting the pixel value that fluctuates as described above, it is desirable to use an average value of the pixel values of the pixels in a predetermined area including the deformed pixel to stabilize processing. When the average value is small, a fluctuation width of the pixel value after the correction is made small. By contrast, when the average value is large, the fluctuation width of the pixel value after the correction is made large.

The fluctuation width from the pixel value before the correction of the deformed pixel is calculated by using the fluctuation width ofst at the time when the pixel value before the correction of the deformed pixel is equal to 0 and a gradient grad of a component proportional to the pixel value before the correction of the deformed pixel. As a result, the upper limit threshold TH_UP and lower limit threshold TH_LW for the correction value are defined by the following formula (1).

$$TH\_UP = Pix + AVE \times grad\_up + ofst$$

$$TH\_LW = Pix + AVE \times grad\_lw + ofst \qquad (1)$$

Note, however, that Pix in formula (1) is a pixel value before the correction of the deformed pixel. AVE is an average value of the pixel values of the pixels in a predetermined area including the deformed pixel. Further, grad_up is a gradient on the upper side. Further, grad_lw is a gradient on the lower side.

Figure 9:
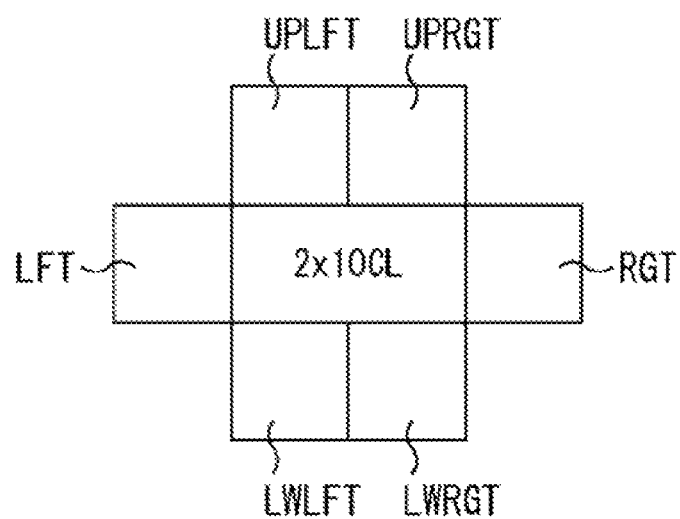
FIG. 9 is a diagram depicting a positional relationship between the irregular pixel and the deformed pixel.
Figure 10:
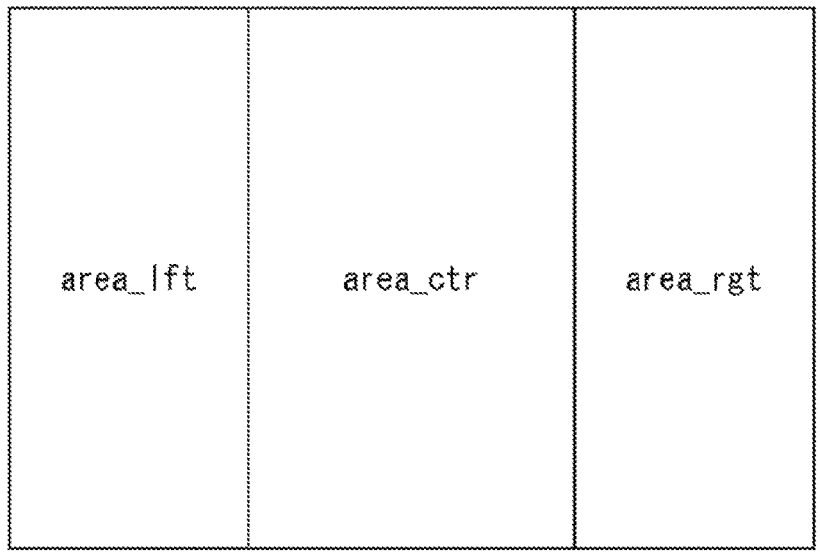
FIG. 10 is a diagram depicting an area in which a parameter is individually defined.

Note that, a deformation degree of the OCL of the deformed pixel is not necessarily the same and may vary depending on a positional relationship (any position to the left, right, top and bottom of the irregular pixel) between the deformed pixel and the irregular pixel, the manufacturing process, or a pixel size. Therefore, regarding the gradients grad_up and grad_lw and the fluctuation width ofst that are parameters for calculating the above-described upper limit threshold TH_UP and lower limit threshold TH_LW, as depicted in FIG. 9, six kinds of values are defined in accordance with a position of the deformed pixel corresponding to the irregular pixel In particular, in a case where asymmetric deformation is seen in the OCL of the deformed pixel, the sensitivity may increase or decrease depending on a position in the image of the deformed pixel. In a case where a lateral symmetry is broken, the entire image just has to be divided into three in the longitudinal direction, for example, as depicted in FIG. 10. Further, in each of the three-divided areas, the above-described parameter just has to be defined so as to be adjusted. Further, in a case where an asymmetry is seen to the left, right, top and bottom of the deformed pixel, the entire image just has to be divided in the longitudinal direction and in the transverse direction and the above-described parameter just has to be defined in each of the divided areas.

Deformed Pixel Correction Processing by the Deformed Pixel Correction Section 15

Figure 11:
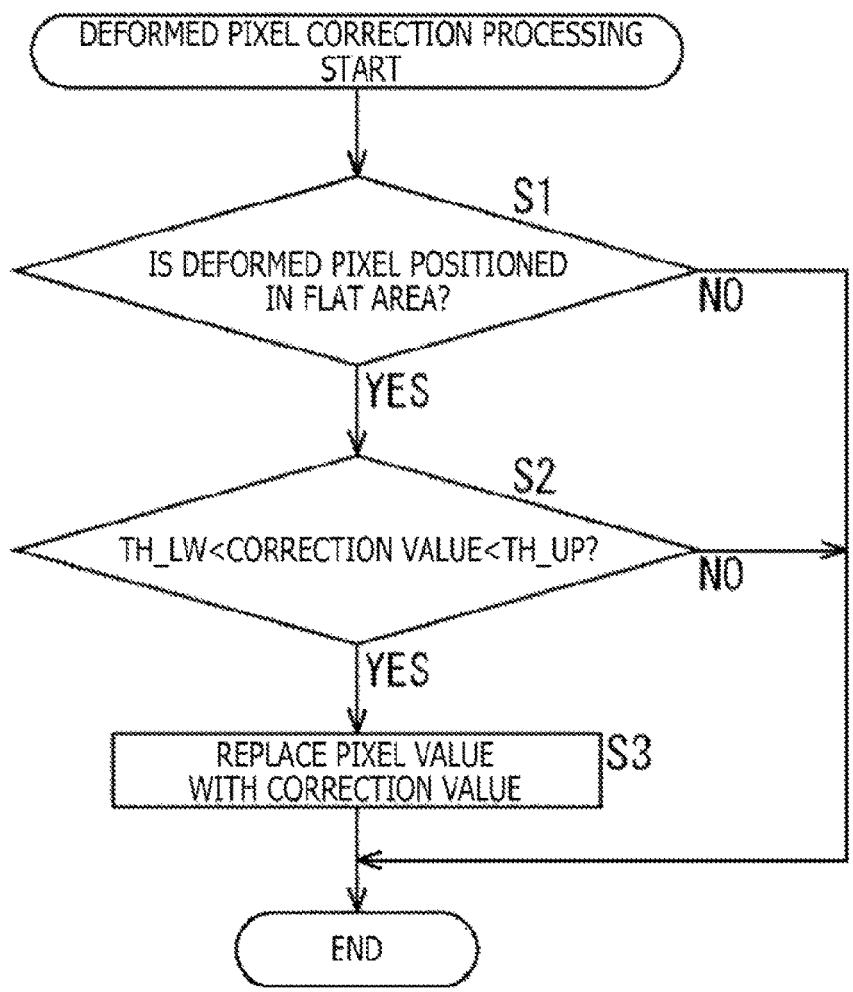
FIG. 11 is a flowchart depicting deformed pixel correction processing.

Next, FIG. 11 is a flowchart depicting the deformed pixel correction processing by the deformed pixel correction section 15.

The deformed pixel correction processing is performed by sequentially assigning the deformed pixel to a processing target. As a prerequisite, a color signal interpolated on a position of the irregular pixel from the irregular pixel interpolation section 13 of the preceding stage and a color signal of the standard pixel and the deformed pixel are assumed to be supplied to the deformed pixel correction section 15. Further, the output of the correction value calculation section 21, the flatness determination section 22, and the threshold calculation section 23 is assumed to be input to the correction section 25 of the deformed pixel correction section 15.

At step S1, on the basis of the input from the flatness determination section 22, the correction section 25 determines whether or not the deformed pixel as the processing target is positioned in a flat area or in an area having a simple texture. If it is determined that the deformed pixel as the processing target is positioned in the flat area or in the area having the simple texture, the process proceeds to step S2.

At step S2, on the basis of the input from the correction value calculation section 21 and the threshold calculation section 23, the correction section 25 determines whether or not the calculated correction value is positioned between the lower limit threshold TH_LW and the upper limit threshold TH_UP. If it is determined that the calculated correction value is positioned between the lower limit threshold TH_LW and the upper limit threshold TH_UP, the process proceeds to step S3.

At step S3, the correction section 25 replaces the pixel value of the deformed pixel as the processing target with a correction value input from the correction value calculation section 21. Then, the deformed pixel correction processing on the processing target ends.

Note that, at step S1, if it is determined that the deformed pixel as the processing target is neither positioned in the flat area nor in the area having the simple texture, a sensitivity influence of the deformed pixel is inconspicuous and therefore the correction is not performed. Therefore, step S3 is skipped and the deformed pixel correction processing ends.

Further, at step S2, even if it is determined that the calculated correction value is not positioned between the lower limit threshold TH_LW and the upper limit threshold TH_UP, the correction in which the pixel value of the deformed pixel is replaced with the calculated correction value may be an erroneous correction, and therefore the correction is not performed. Therefore, step S3 is skipped and the deformed pixel correction processing ends.

As described above, the image sensor 10 according to the present embodiment not only interpolates a color signal in a position of the irregular pixel (2×1 OCL pixel) but also corrects the pixel value of the deformed pixel in which the OCL on the periphery of the irregular pixel is deformed from an original shape. Therefore, it is possible to suppress an apparent uncomfortable feeling on the phase difference detection pixel and the periphery thereof in the image.

Further, it is possible to adjust an upper limit and lower limit of the correction value in accordance with a relative positional relationship of the deformed pixel to the irregular pixel and a position of the deformed pixel in the image. Therefore, it is possible to suppress an overcorrection and more appropriately correct the pixel value of the deformed pixel.

Note that, in the present embodiment, a purpose of the irregular pixel having the 2×1 OCL is for a phase difference detection for the phase difference AF control. Further, a purpose of the irregular pixel that is different, in a shape of the OCL, from the standard pixel is not limited to the phase difference detection.

First Application Example

The technology according to the present disclosure can be applied to various products. For example, the technology according to the present disclosure may be applied to an in-vivo information acquisition system of a patient using a capsule type endoscope.

Figure 12:
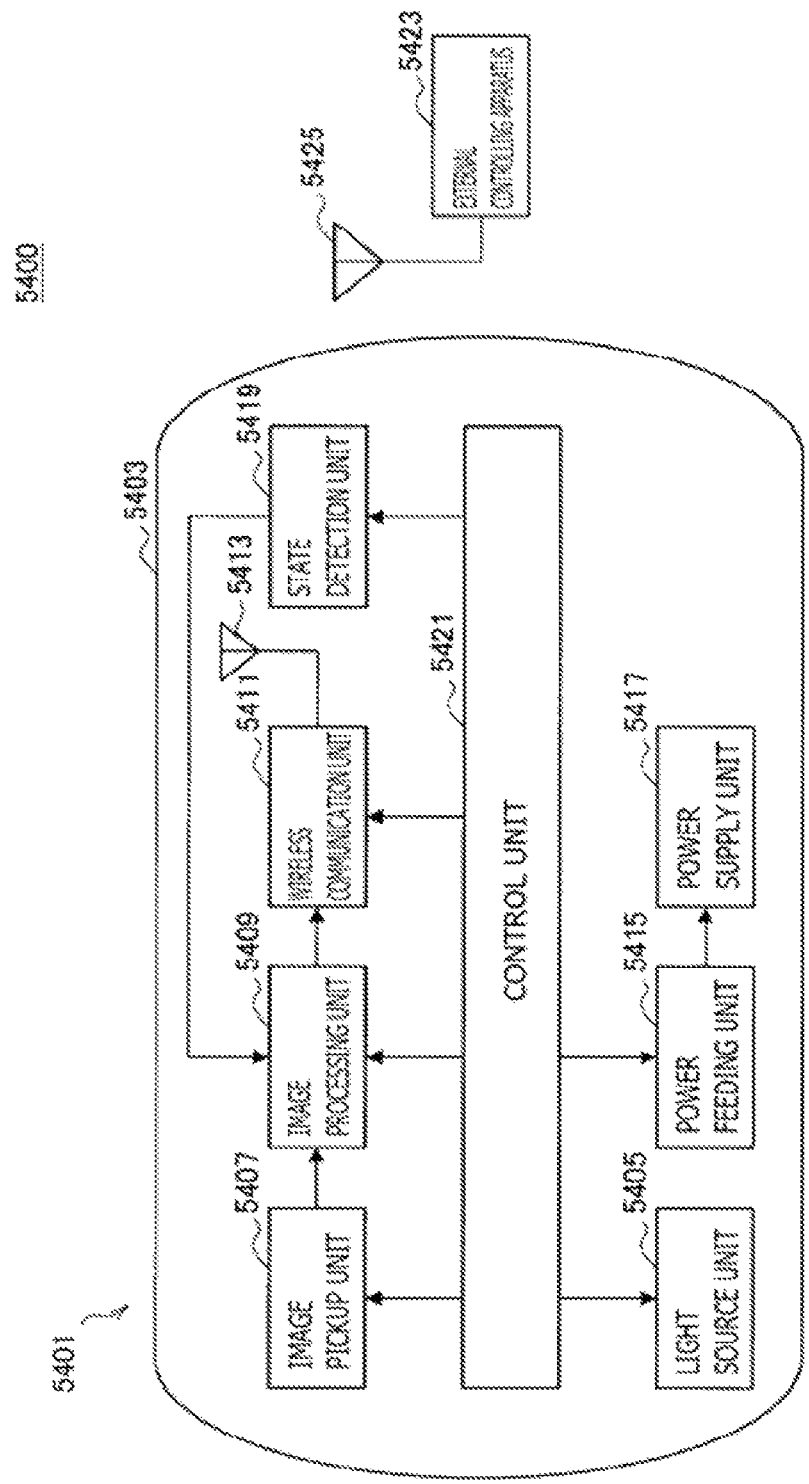
FIG. 12 is a block diagram depicting an example of a schematic configuration of an in-vivo information acquisition system.

FIG. 12 is a view depicting an example of a schematic configuration of an in-vivo information acquisition system 5400 to which the technology according to an embodiment of the present disclosure can be applied. Referring to FIG. 12, the in-vivo information acquisition system 5400 includes a capsule type endoscope 5401, and an external controlling apparatus 5423 which integrally controls operation of the in-vivo information acquisition system 5400. Upon inspection, the capsule type endoscope 5401 is swallowed by a patient. The capsule type endoscope 5401 has an image pickup function and a wireless communication function. For a period of time before the capsule type endoscope 5401 is discharged naturally from the patient, while it moves in the inside of an organ such as the stomach or the intestines by peristaltic motion, it successively picks up an image in the inside of each organ (hereinafter referred to as in-vivo image) at predetermined intervals and successively transmits information of the in-vivo images in wireless fashion to the external controlling apparatus 5423 located outside the body. The external controlling apparatus 5423 generates image data for displaying the in-vivo images on a display apparatus (not depicted) on the basis of the information of the received in-vivo images. In this manner, in the in-vivo information acquisition system 5400, a picked up image illustrating a state of the inside of the body of the patient can be obtained at any time after the capsule type endoscope 5401 is swallowed until it is discharged.

A configuration and functions of the capsule type endoscope 5401 and the external controlling apparatus 5423 are described in more detail. As depicted, the capsule type endoscope 5401 has functions of a light source unit 5405, an image pickup unit 5407, an image processing unit 5409, a wireless communication unit 5411, a power feeding unit 5415, a power supply unit 5417, a state detection unit 5419 and a control unit 5421 incorporated in a housing 5403 of the capsule type.

The light source unit 5405 includes a light source such as, for example, a light emitting diode (LED) and irradiates light upon an image pickup field of view of the image pickup unit 5407.

The image pickup unit 5407 includes an image pickup element and an optical system formed from a plurality of lenses provided at a preceding stage to the image pickup element. Reflected light (hereinafter referred to as observation light) of light irradiated upon a body tissue which is an observation target is condensed by the optical system and enters the image pickup element. The image pickup element receives and photoelectrically converts the observation light to generate an electric signal corresponding to the observation light, namely, an image signal corresponding to an observation image. The image signal generated by the image pickup unit 5407 is provided to the image processing unit 5409. It is to be noted that, as the image pickup element of the image pickup unit 5407, various known image pickup elements such as a complementary metal oxide semiconductor (CMOS) image sensor or a charge coupled device (CCD) image sensor may be used.

The image processing unit 5409 includes a processor such as a central processing unit (CPU) or a graphics processing unit (GPU) and performs various signal processes for an image signal generated by the image pickup unit 5407. The signal processes may be minimal processes for transmitting an image signal to the external controlling apparatus 5423 (for example, compression of image data, conversion of the frame rate, conversion of the data rate, and/or conversion of the format). Since the image processing unit 5409 is configured so as to perform only the minimal processes, the image processing unit 5409 can be implemented in a smaller size with lower power consumption. Therefore, the image processing unit 5409 is suitable for the capsule type endoscope 5401. However, if the space in the housing 5403 or the power consumption affords, then the image processing unit 5409 may perform a further signal process (for example, a noise removal process or some other image quality improving process). The image processing unit 5409 provides an image signal, for which the signal processes have been performed, as RAW data to the wireless communication unit 5411. It is to be noted that, when information regarding a state (motion, posture or the like) of the capsule type endoscope 5401 is acquired by the state detection unit 5419, the image processing unit 5409 may provide an image signal in a tied manner with the information to the wireless communication unit 5411. This makes it possible to associate the position inside the body at which an image is picked up, an image pickup direction of the image or the like with the picked up image.

The wireless communication unit 5411 includes a communication apparatus which can transmit and receive various kinds of information to and from the external controlling apparatus 5423. The communication apparatus includes an antenna 5413, a processing circuit which performs a modulation process and so forth for transmission and reception of a signal, and so forth. The wireless communication unit 5411 performs a predetermined process such as a modulation process for an image signal for which the signal processes have been performed by the image processing unit 5409, and transmits the resulting image signal to the external controlling apparatus 5423 through the antenna 5413. Further, the wireless communication unit 5411 receives a control signal relating to driving control of the capsule type endoscope 5401 from the external controlling apparatus 5423 through the antenna 5413. The wireless communication unit 5411 provides the received control signal to the control unit 5421.

The power feeding unit 5415 includes an antenna coil for power reception, a power regeneration circuit for regenerating electric power from electric current generated in the antenna coil, a voltage booster circuit and so forth. The power feeding unit 5415 generates electric power using the principle of non-contact charging. Specifically, if a magnetic field (electromagnetic wave) of a predetermined frequency is provided from the outside to the antenna coil of the power feeding unit 5415, then induced electromotive force is generated in the antenna coil. The electromagnetic wave may be a carrier transmitted from the external controlling apparatus 5423 through an antenna 5425. Electric power is regenerated from the induced electromotive force by the power regeneration circuit, and the potential of the electric power is suitably adjusted by the voltage booster circuit to generate electric power for charging. The electric power generated by the power feeding unit 5415 is stored into the power supply unit 5417.

The power supply unit 5417 includes a secondary battery and stores electric power generated by the power feeding unit 5415. In FIG. 12, in order to avoid complicated illustration, an arrow mark indicative of a supplying destination of electric power from the power supply unit 5417 and so forth are not depicted. However, electric power stored in the power supply unit 5417 is supplied to the light source unit 5405, the image pickup unit 5407, the image processing unit 5409, the wireless communication unit 5411, the state detection unit 5419 and the control unit 5421 and can be used for driving of them.

The state detection unit 5419 includes a sensor for detecting a state of the capsule type endoscope 5401 such as an acceleration sensor and/or a gyro sensor. The state detection unit 5419 can acquire information relating to a state of the capsule type endoscope 5401 from a result of detection by the sensor. The state detection unit 5419 provides the acquired information regarding a state of the capsule type endoscope 5401 to the image processing unit 5409. The image processing unit 5409 can tie the information regarding a state of the capsule type endoscope 5401 with an image signal as described hereinabove.

The control unit 5421 includes a processor such as a CPU and operates in accordance with a predetermined program to integrally control operation of the capsule type endoscope 5401. The control unit 5421 suitably controls driving of the light source unit 5405, the image pickup unit 5407, the image processing unit 5409, the wireless communication unit 5411, the power feeding unit 5415, the power supply unit 5417 and the state detection unit 5419 in accordance with a control signal transmitted thereto from the external controlling apparatus 5423 to implement such functions of the components as described above.

The external controlling apparatus 5423 may be a processor such as a CPU or a GPU, a microcomputer or a control board in which a processor and a storage element such as a memory are mixedly incorporated. The external controlling apparatus 5423 is configured such that it has an antenna 5425 and can transmit and receive various kinds of information to and from the capsule type endoscope 5401 through the antenna 5425. Specifically, the external controlling apparatus 5423 transmits a control signal to the control unit 5421 of the capsule type endoscope 5401 to control operation of the capsule type endoscope 5401. For example, an irradiation condition of light upon an observation target of the light source unit 5405 can be changed in accordance with a control signal from the external controlling apparatus 5423. Further, an image pickup condition (for example, a frame rate, an exposure value or the like of the image pickup unit 5407) can be changed in accordance with a control signal from the external controlling apparatus 5423. Further, the substance of processing by the image processing unit 5409 or a condition for transmitting an image signal from the wireless communication unit 5411 (for example, a transmission interval, a transmission image number or the like) may be changed in accordance with a control signal from the external controlling apparatus 5423.

Further, the external controlling apparatus 5423 performs various image processes for an image signal transmitted from the capsule type endoscope 5401 to generate image data for displaying a picked up in-vivo image on the display apparatus. As the image processes, various known signal processes may be performed such as, for example, a development process (demosaic process), an image quality improving process (bandwidth enhancement process, super-resolution process, noise reduction (NR) process, and/or image stabilization process) and/or an enlargement process (electronic zoom process) or the like. The external controlling apparatus 5423 controls driving of the display apparatus (not depicted) to cause the display apparatus to display a picked up in-vivo image on the basis of generated image data. Alternatively, the external controlling apparatus 5423 may control a recording apparatus (not depicted) to record generated image data or control a printing apparatus (not depicted) to output generated image data by printing.

As described above, an example of the in-vivo information acquisition system 5400 to which the technology according to the present disclosure is applicable is described. The technology according to the present disclosure can be preferably applied to the image pickup unit 5407 in the configuration described above.

Second Application Example

For example, the technology according to the present disclosure may be implemented as apparatuses mounted on any type of mobile objects such as automobiles, electric vehicles, hybrid electric vehicles, motorcycles, bicycles, personal mobilities, airplanes, drones, ships, robots, construction machines, and agricultural machines (tractors).

Figure 13:
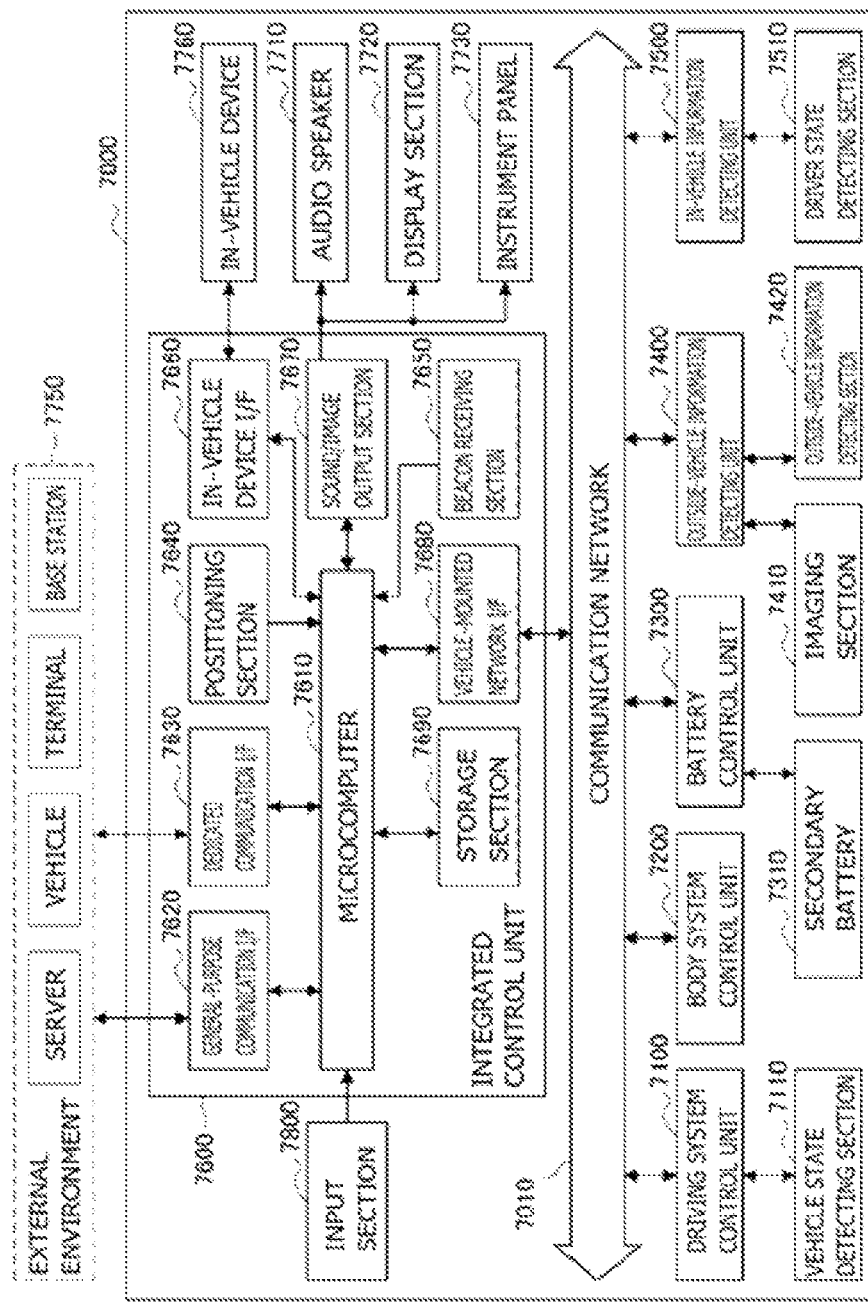
FIG. 13 is a block diagram depicting an example of schematic configuration of a vehicle control system.

FIG. 13 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 13, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay, or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 13 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 14:
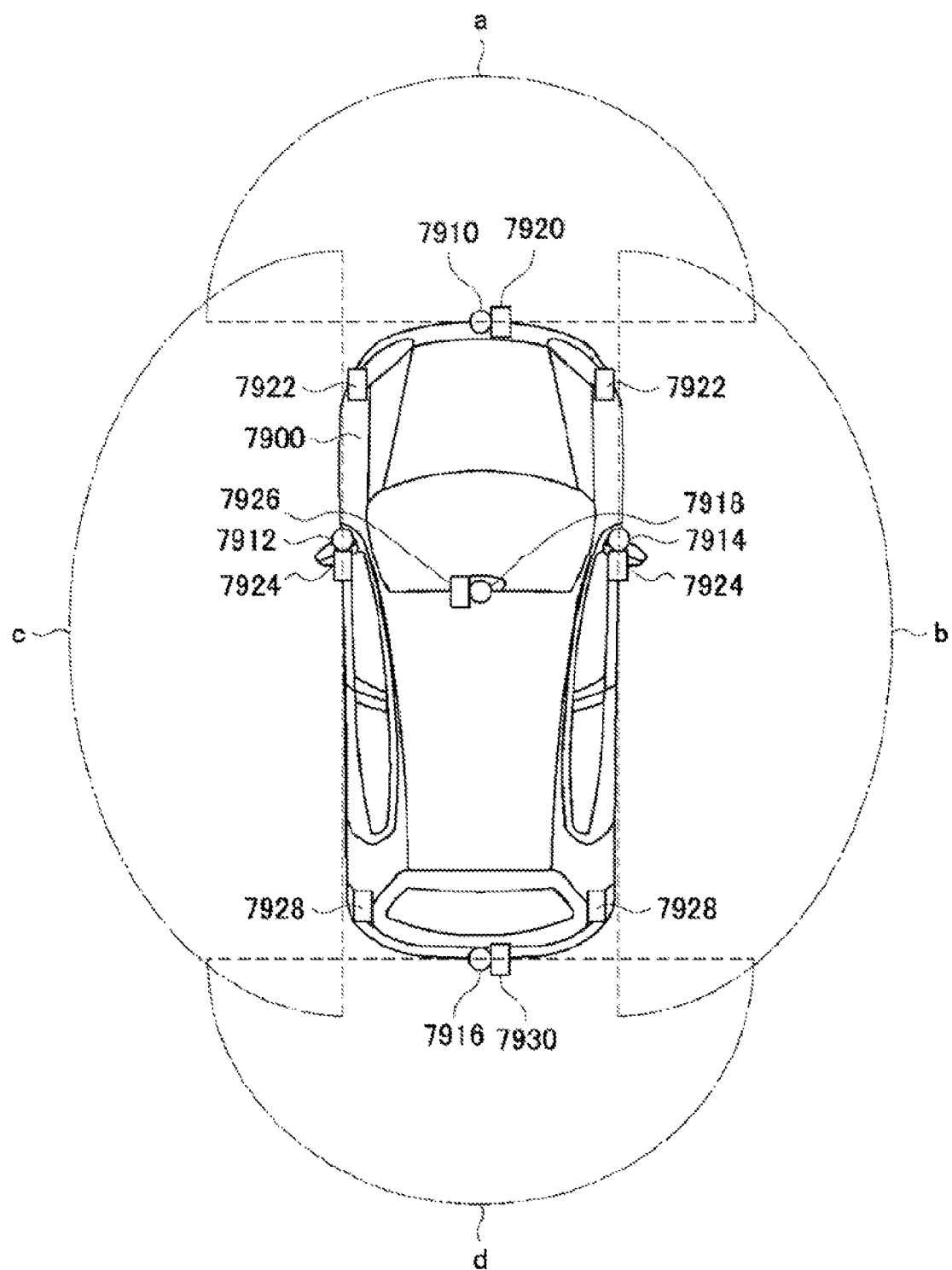
FIG. 14 is a diagram of assistance in explaining an example of installation positions of an outside-vehicle information detecting section and an imaging section.

FIG. 14 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 13, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM, trademark), worldwide interoperability for microwave access (WiMAX), long term evolution (LTE)), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI, trademark), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 13, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 13 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

It should be noted that computer programs for realizing the respective functions of an image sensor 10 according to the present embodiment can be implemented in any one of the control units etc. Also, a computer-readable recording medium storing such computer programs can be provided. The recording medium is, for example, a magnetic disk, an optical disc, a magneto-optical disc, a flash memory, and the like. Also, the above computer programs may be delivered, for example, via a network rather than using a recording medium.

In the vehicle control system 7000 described above, the image sensor 10 according to the present embodiment can be applied to the integrated control unit 7600 as an application example illustrated in FIG. 13.

Further, at least a portion of configuration elements of the image sensor 10 may be implemented in a module (e.g., an integrated circuit module configured by one die) for the integrated control unit 7600 illustrated in FIG. 13. Alternatively, the image sensor 10 may be implemented by using a plurality of control units of the vehicle control system 7000 illustrated in FIG. 13.

Note that, embodiments of the present disclosure are not limited to those described above and can be modified in various ways without departing from the gist of the present disclosure.

The present disclosure can have the following configurations:

(1) A solid-state image pickup apparatus including:
a pixel array in which a first pixel in which an OCL (On Chip Lens) of a standard size is formed and a second pixel in which an OCL of a size different from the standard size is formed are present mixedly; and
a correction section that corrects a pixel value of the first pixel that is positioned in the vicinity of the second pixel among the first pixels on the pixel array.

(2) The solid-state image pickup apparatus according to (1), in which
the correction section corrects a pixel value of a third pixel that is positioned in the vicinity of the second pixel and in which a shape of the OCL is deformed from an original standard size among the first pixels on the pixel array.

(3) The solid-state image pickup apparatus according to (2), in which
an OCL having a size larger than the standard size is formed in the second pixel.

(4) The solid-state image pickup apparatus according to (2) or (3), in which
the correction section calculates a correction value that is replaced with a pixel value of the third pixel as a correction target by using a pixel value of the first pixel that is positioned in the vicinity of the third pixel as the correction target.

(5) The solid-state image pickup apparatus according to any one of (1) to (4), in which
the correction section decides a threshold for determining whether or not the calculated correction value is applied.

(6) The solid-state image pickup apparatus according to (5), in which
the correction section decides the threshold by using a parameter that is different depending on a positional relationship between the third pixel as the correction target and the second pixel.
(7) The solid-state image pickup apparatus according to (5), in which
the correction section decides the threshold by using a parameter that is different depending on a position in an image of the third pixel as the correction target.
(8) The solid-state image pickup apparatus according to any one of (2) to (7), in which
the correction section determines whether or not the calculated correction value is applied on the basis of a flatness in a peripheral area of the third pixel as the correction target.
(9) The solid-state image pickup apparatus according to any one of (1) to (8), in which
the second pixel is a phase difference detection pixel.
(10) The solid-state image pickup apparatus according to any one of (1) to (9), further including:
an interpolation section that interpolates a pixel value corresponding to a position of the second pixel.
(11) A method for correcting a solid-state image pickup apparatus including a pixel array in which a first pixel in which an OCL (On Chip Lens) of a standard size is formed and a second pixel in which an OCL of a size different from the standard size is formed are present mixedly and a correction section that corrects an output of the pixel array, the method including:
a correction step of correcting, by the correction section, a pixel value of the first pixel that is positioned in the vicinity of the second pixel among the first pixels on the pixel array.
(12) An electronic apparatus including:
a solid-state image pickup apparatus to be mounted thereon, in which
the solid-state image pickup apparatus includes
a pixel array in which a first pixel in which an OCL (On Chip Lens) of a standard size is formed and a second pixel in which an OCL of a size different from the standard size is formed are present mixedly, and
a correction section that corrects a pixel value of the first pixel that is positioned in the vicinity of the second pixel among the first pixels on the pixel array.

REFERENCE SIGNS LIST

10 Image sensor, 11 Pixel array, 12 Phase difference detection section, 13 Irregular pixel interpolation section, 14 AF control section, 15 Deformed pixel correction section, 16 Defective pixel correction section, 17 Camera signal processing section, 21 Correction value calculation section, 22 Flatness determination section, 23 Threshold calculation section, 24 Average value calculation section, 25 Correction section

The invention claimed is:
1. A solid-state image pickup apparatus, comprising:
a pixel array having first pixels each with an OCL (On Chip Lens) of a standard size formed thereon and a second pixel with an OCL of a size different than the standard size formed thereon arranged mixedly; and
a correction section that corrects a pixel value of a first pixel that is positioned in a vicinity of the second pixel among the first pixels on the pixel array,
wherein the second pixel is a phase difference detection pixel.
2. The solid-state image pickup apparatus according to claim 1, wherein the correction section corrects a pixel value of a third pixel that is positioned in the vicinity of the second pixel and in which a shape of the OCL is deformed from an original standard size among the first pixels on the pixel array.
3. The solid-state image pickup apparatus according to claim 1, wherein an OCL having a size larger than the standard size is formed in the second pixel.
4. The solid-state image pickup apparatus according to claim 2, wherein the correction section calculates a correction value that is replaced with a pixel value of the third pixel as a correction target by using a pixel value of the first pixel that is positioned in a vicinity of the third pixel as the correction target.
5. The solid-state image pickup apparatus according to claim 4, wherein the correction section decides a threshold for determining whether or not the calculated correction value is applied.
6. The solid-state image pickup apparatus according to claim 5, wherein the correction section decides the threshold by using a parameter that is different depending on a positional relationship between the third pixel as the correction target and the second pixel.
7. The solid-state image pickup apparatus according to claim 5, wherein the correction section decides the threshold by using a parameter that is different depending on a position in an image of the third pixel as the correction target.
8. The solid-state image pickup apparatus according to claim 4, wherein the correction section determines whether or not the calculated correction value is applied on a basis of a flatness in a peripheral area of the third pixel as the correction target.
9. The solid-state image pickup apparatus according to claim 1, further comprising an interpolation section that interpolates a pixel value corresponding to a position of the second pixel.
10. A method for correcting a solid-state image pickup apparatus including a pixel array having first pixels each with an OCL (On Chip Lens) of a standard size formed thereon and a second pixel with an OCL of a size different than the standard size formed thereon arranged mixedly and a correction section that corrects an output of the pixel array, the method comprising:
a correction step of correcting, by the correction section, a pixel value of a first pixel that is positioned in a vicinity of the second pixel among the first pixels on the pixel array,
wherein the second pixel is a phase difference detection pixel.
11. The method for correcting a solid-state image pickup apparatus according to claim 10, further comprising the step of correcting, by the correction section, a pixel value of a third pixel that is positioned in the vicinity of the second pixel and in which a shape of the OCL is deformed from an original standard size among the first pixels on the pixel array.
12. The method for correcting a solid-state image pickup apparatus according to claim 11, further comprising the step of calculating, by the correction section, a correction value that is replaced with a pixel value of the third pixel as a correction target by using a pixel value of the first pixel that is positioned in a vicinity of the third pixel as the correction target.

13. The method for correcting a solid-state image pickup apparatus according to claim 12, further comprising the step of deciding, by the correction section, a threshold for determining whether or not the calculated correction value is applied.

14. The method for correcting a solid-state image pickup apparatus according to claim 13, further comprising the step of deciding, by the correction section, the threshold by using a parameter that is different depending on a positional relationship between the third pixel as the correction target and the second pixel.

15. The method for correcting a solid-state image pickup apparatus according to claim 13, further comprising the step of deciding, by the correction section, the threshold by using a parameter that is different depending on a position in an image of the third pixel as the correction target.

16. The method for correcting a solid-state image pickup apparatus according to claim 12, further comprising the step of determining, by the correction section, whether or not the calculated correction value is applied on a basis of a flatness in a peripheral area of the third pixel as the correction target.

17. The method for correcting a solid-state image pickup apparatus according to claim 10, further comprising the step of interpolating, by an interpolation section, a pixel value corresponding to a position of the second pixel.

18. An electronic apparatus comprising:
a solid-state image pickup apparatus to be mounted thereon,
wherein the solid-state image pickup apparatus includes:
a pixel array having first pixels each with an OCL (On Chip Lens) of a standard size formed thereon and a second pixel with an OCL of a size different than the standard size formed thereon arranged mixedly, and
a correction section that corrects a pixel value of a first pixel that is positioned in a vicinity of the second pixel among the first pixels on the pixel array,
wherein the second pixel is a phase difference detection pixel.

19. The electronic apparatus according to claim 18, wherein the correction section corrects a pixel value of a third pixel that is positioned in the vicinity of the second pixel and in which a shape of the OCL is deformed from an original standard size among the first pixels on the pixel array.

20. The electronic apparatus according to claim 18, wherein an OCL having a size larger than the standard size is formed in the second pixel.

* * * * *